United States Patent
Kim et al.

(10) Patent No.: US 11,428,969 B2
(45) Date of Patent: Aug. 30, 2022

(54) OPTICAL DISPLAY INCLUDING A LIGHT SHIELDING LAYER HAVING PRINTED PATTERNS

(71) Applicant: Samsung SDI Co., Ltd., Yongin-si (KR)

(72) Inventors: Jin Woo Kim, Suwon-si (KR); Yoo Jin Kim, Suwon-si (KR); Dong Yoon Shin, Suwon-si (KR); Bae Wook Lee, Suwon-si (KR); Ji Hyun Hwang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 55 days.

(21) Appl. No.: 16/205,102

(22) Filed: Nov. 29, 2018

(65) Prior Publication Data

US 2019/0196249 A1    Jun. 27, 2019

(30) Foreign Application Priority Data

Dec. 21, 2017   (KR) .................. 10-2017-0177599

(51) Int. Cl.
*G02F 1/1333*   (2006.01)
*G02B 5/30*   (2006.01)
(Continued)

(52) U.S. Cl.
CPC ......... *G02F 1/133308* (2013.01); *G02B 5/30* (2013.01); *G02F 1/133512* (2013.01);
(Continued)

(58) Field of Classification Search
CPC combination set(s) only.
See application file for complete search history.

(56) References Cited

U.S. PATENT DOCUMENTS

2011/0221719 A1   9/2011   Kim et al.
2014/0063433 A1*  3/2014   Benson ............ G02F 1/133308
                                                      349/155

(Continued)

FOREIGN PATENT DOCUMENTS

JP        2002-72186 A     3/2002
JP        2009-229538 A    10/2009
(Continued)

OTHER PUBLICATIONS

Office Action dated Oct. 25, 2019 in corresponding Korean Patent Application No. 10-2017-0177599 (6 pgs.).
(Continued)

*Primary Examiner* — Lauren Nguyen
(74) *Attorney, Agent, or Firm* — Lewis Roca Rothgerber Christie LLP

(57) ABSTRACT

An optical display includes an optical display element including a second substrate, a first substrate facing the second substrate, a dummy region and a metal interconnection layer thereon. A first polarizing plate on an upper surface of the optical display element has a light shielding layer therein including printed patterns separated from each other. A first printed layer includes a first point at an interface between the display and non-display regions and a second point at a vertex closest to the first point. A second printed layer includes a third point at the interface and a fourth point at a vertex closes to the third point. The light shielding layer satisfies H≤P/2, where H is a minimum value among a distance from the interface to the second point and a distance from the interface to the fourth point, and P is a width of the dummy region.

18 Claims, 2 Drawing Sheets

(51) Int. Cl.
  *G02F 1/1335* (2006.01)
  *G02F 1/1362* (2006.01)
  *H01L 27/32* (2006.01)

(52) U.S. Cl.
  CPC .. *G02F 1/133528* (2013.01); *G02F 1/133548* (2021.01); *G02F 1/136209* (2013.01); *G02B 5/3025* (2013.01); *H01L 27/3232* (2013.01)

(56) References Cited

U.S. PATENT DOCUMENTS

2014/0354923 A1* 12/2014 Lee ................ G02B 1/113
  349/96
2015/0062497 A1* 3/2015 Nam ............... G02F 1/133536
  349/96
2016/0357064 A1* 12/2016 Nielson ........... G02F 1/133536

FOREIGN PATENT DOCUMENTS

| KR | 10-2015-0015243 A | 2/2015 |
| KR | 10-2016-0038559 A | 4/2016 |
| KR | 10-2017-0086780 A | 7/2017 |
| TW | 201409092 A | 3/2014 |
| WO | WO 2017/126883 A1 | 7/2017 |

OTHER PUBLICATIONS

Taiwan Office Action in corresponding Taiwan Application No. 107142284, Taiwan Office Action dated Mar. 5, 2020 (12 pgs.).

* cited by examiner

OPTICAL DISPLAY INCLUDING A LIGHT SHIELDING LAYER HAVING PRINTED PATTERNS

CROSS-REFERENCE TO RELATED APPLICATION

This application claims priority to and the benefit of Korean Patent Application 10-2017-0177599, filed on Dec. 21, 2017, the entire disclosure of which is incorporated herein by reference.

BACKGROUND

1. Field

The present invention relates to an optical display.

2. Description of Related Art

An optical display includes a display region and a non-display region. The display region is light transmissive and displays an image to be viewed through a screen. The non-display region is disposed along the periphery of the display region to surround the display region. The non-display region is an opaque region and is provided with a metal interconnection layer, a printed circuit board, a drive chip, and the like to display an image. The printed circuit board, the drive chip, and the like are shielded so as not to be visible by a user of the optical display.

The optical display includes optical display elements. The optical display elements may include a color filter substrate with a color filter layer formed thereon and a thin film transistor (TFT) substrate with a metal interconnection layer formed thereon. The color filter substrate and the TFT substrate are disposed to face each other. The TFT substrate may extend beyond the color filter substrate such that the metal interconnection layer, the printed circuit board, and the like can be disposed on the extended portion of the TFT substrate. Generally, a black matrix layer is interposed between the TFT substrate and a polarizing plate to prevent the metal interconnection layer, the printed circuit board, and the like from being visible. The black matrix layer may be formed by coating a black matrix composition onto the TFT substrate. However, the thickness of the optical display can be increased due to the presence of the black matrix layer.

One example of the background technique of the present invention is disclosed in Korean Patent Publication No. 2015-0015243, the entire content of which is incorporated herein by reference.

SUMMARY

The present disclosure is directed to various embodiments of an optical display having a slim structure.

The present disclosure is also directed to various embodiments of an optical display that can conceal a metal interconnection layer even when a polarizing plate shrinks or expands under high temperature and/or high temperature and high humidity conditions.

It is a further aspect of various embodiments of the present disclosure to provide an optical display that includes a TFT substrate extending beyond a color filter substrate such that a metal interconnection layer is disposed on the extended portion of the TFT substrate, while preventing the metal interconnection layer from being visible even when a polarizing plate shrinks or expands under high temperature and/or high temperature and high humidity conditions.

It is yet another aspect of various embodiments of the present disclosure to provide an optical display which can minimize difference in visibility between a display region and a non-display region.

An optical display having display region and a non-display region according to one embodiment of the present disclosure includes an optical display element including a second substrate and a first substrate facing the second substrate, a dummy region on the first substrate, and a metal interconnection layer on the first substrate. The optical display also includes a first polarizing plate on an upper surface of the optical display element. The first polarizing plate has a light shielding layer formed therein to conceal at least a portion of the metal interconnection layer. The light shielding layer includes a series of printed patterns separated from each other and each comprising a single printed layer or multiple printed layers, each of the printed patterns includes a first printed layer. The first printed layer of a first printed pattern of the series of printed patterns includes a first point at an interface between the display region and the non-display region. The first printed layer of the first printed pattern includes a second point at a vertex of the first printed layer that is closest to the first point. The first printed layer of a second printed pattern of the series of printed patterns adjacent to the first printed layer of the first printed pattern includes a third point at the interface. The first printed layer of the second printed pattern includes a fourth point at a vertex of the first printed layer of the second printed pattern that is closest to the third point. The first printed layer of the first printed pattern and the first printed layer of the second printed pattern satisfy Equation 1:

$H \leq P/2$, wherein $H$ is a minimum value among a distance from the interface to the second point and a distance from the interface to the fourth point, and $P$ is a width of the dummy region.  Equation 1

In Equation 1, H may be about 200 μm or less.
In Equation 1, P may be about 400 μm or less.
The printed patterns may satisfy Equation 2:

$0.1 \times W \leq H \leq 0.5 \times W$, wherein $W$ is a distance from the first point to the third point.  Equation 2

Each of the printed patterns may include the first printed layer and a second printed layer directly on the first printed layer. The first printed layer of the first printed pattern may include a fifth point closest to the interface between the display region and the non-display region. A shortest distance between the fifth point and the first point may be 200 μm or less.

The first printed layer may have a regular hexagonal shape and the second printed layer may have a rhombic, square, or amorphous shape.

The first polarizing plate may include a polarizer; and a bonding layer and a first polarizer protective film sequentially stacked on one surface of the polarizer. The light shielding layer may be on one surface of the first polarizer protective film and embedded in the bonding layer.

The light shielding layer may have a thickness of about 4 μm or less.

The light shielding layer may include at least one of carbon black and a mixed pigment of silver-tin alloys.

The first polarizing plate may be at a side of the first substrate of the optical display element.

Each of the first substrate and the first polarizing plate may extend beyond the second substrate.

The first polarizing plate may include a main body facing the first substrate and an extended portion directly connected to the main body and not facing the first substrate. The light shielding layer may be in the extended portion and a portion of the main body.

The first substrate may include a main body facing the second substrate and an extended portion directly connected to the main body and not facing the second substrate. The metal interconnection layer may include a first metal interconnection layer on the main body of the first substrate and a second metal interconnection layer on the extended portion of the first substrate.

The dummy region may be between the first metal interconnection layer and a pixel region constituting the display region of the first substrate.

The light shielding layer may face the first metal interconnection layer, the second metal interconnection layer, and a portion of the dummy region.

The light shielding layer may face the first metal interconnection layer, the second metal interconnection layer, and an entirety of the dummy region.

The optical display may further include a second polarizing plate on a lower surface of the optical display element.

The optical display element may include a liquid crystal panel including a liquid crystal layer or a light emitting diode substrate including a luminous material.

An optical display according to one or more embodiments of the present disclosure has a slim structure.

An optical display according to one or more embodiments of the present disclosure is configured to conceal a metal interconnection layer even when a polarizing plate shrinks or expands under high temperature and/or high temperature and high humidity conditions.

An optical display according to one or more embodiments of the present disclosure includes a TFT substrate extending beyond a color filter substrate such that a metal interconnection layer and the like are disposed on the extended portion of the TFT substrate, and the metal interconnection layer is concealed even when a polarizing plate shrinks or expands under high temperature and/or high temperature and high humidity conditions.

An optical display according to one or more embodiments of the present disclosure is configured to minimize a difference in visibility between a display region and a non-display region.

DETAILED DESCRIPTION

Figure 1:
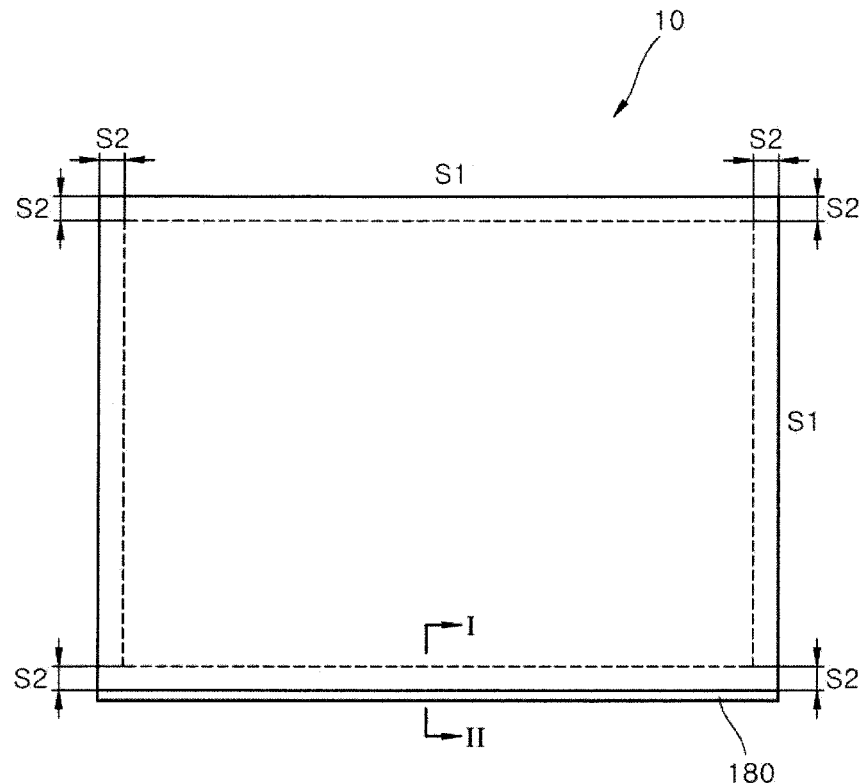
FIG. 1 is a plan view of an optical display according to one embodiment of the present invention.

Embodiments of the present invention will be described in detail with reference to the accompanying drawings to provide thorough understanding of the invention to those skilled in the art. It should be understood that the present invention may be embodied in different ways and is not limited to the following embodiments. In the drawings, portions irrelevant to the description will be omitted for clarity. Like components will be denoted by like reference numerals throughout the specification.

Herein, spatially relative terms such as "upper" and "lower" are defined with reference to the accompanying drawings. Thus, it will be understood that the term "upper surface" can be used interchangeably with the term "lower surface", and when an element such as a layer or a film is referred to as being placed "on" another element, it can be directly placed on the other element, or intervening element(s) may be present. On the other hand, when an element is referred to as being placed "directly on" another element, there are no intervening element(s) therebetween.

Figure 2:
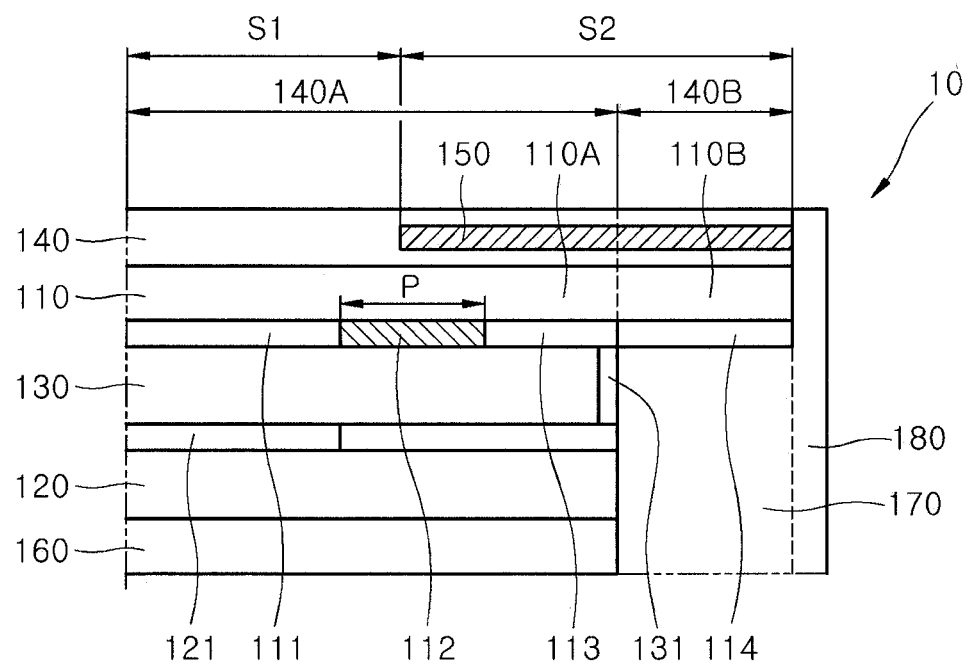
FIG. 2 is a partial sectional view of the optical display of FIG. 1, taken along line I-II.

An optical display according to one embodiment of the present invention will be described with reference to FIG. 1 and FIG. 2. FIG. 1 is a plan view of an optical display according to one embodiment of the present invention. FIG. 2 is a partial sectional view of the optical display of FIG. 1, taken along line I-II.

Referring to FIG. 1, the optical display 10 may be composed of: a display region S1; and a non-display region S2 formed along a periphery of the display region S1. Although the non-display region S2 is shown as surrounding the entire periphery of the display region S1 in FIG. 1, it should be understood that the present invention is not limited thereto. Alternatively, the non-display region may be located only at right and left sides of the display region, or may be located only at one of a right side, a left side, an upper side, and a lower side of the display region S1.

The optical display 10 has a frame 180 formed at a lower side thereof, as viewed from the front. Referring to FIG. 2, the frame 180 directly contacts a first polarizing plate 140, a first substrate 110, and a securing member 170. In one embodiment, the respective contact portions may be integrally formed with one another. Accordingly, the frame 180 can support each of the first polarizing plate 140 and the first substrate 110, thereby supporting the optical display 10 including the display region S1 and the non-display region S2. However, it should be understood that the present invention is not limited thereto and the frame may directly contact only the first polarizing plate and the first substrate. The frame may be formed of any suitable plastic material known in the art, although the present disclosure is not limited thereto.

Although the frame 180 is shown as formed on one surface of the optical display in FIG. 1, it should be understood that the present invention is not limited thereto and the optical display may have a frameless structure. Although not shown in FIG. 1, a support may be connected to the optical display via the lower side of the optical display (e.g., the frame) to support the optical display.

Referring to FIG. 2, the optical display 10 may include a liquid crystal panel, the first polarizing plate 140 may be disposed on an upper surface of the liquid crystal panel, and the second polarizing plate 160 may be disposed on a lower surface of the liquid crystal panel. In one embodiment, the first polarizing plate 140 may be formed on a light exit surface of the liquid crystal panel and the second polarizing plate 160 may be formed on a light incident surface of the liquid crystal panel.

Although the optical display is shown as including the liquid crystal panel as an optical display element in FIG. 2, it should be understood that the present invention is not limited thereto. Alternatively, the optical display may include a light emitting diode containing a luminous material as an optical display element.

The liquid crystal panel may include the first substrate 110, a second substrate 120 formed under the first substrate 110 and facing the first substrate 110, and a liquid crystal layer 130 formed between the first substrate 110 and the second substrate 120.

The liquid crystal layer 130 may include a liquid crystal that is uniformly oriented when an electric field is not applied thereto. In one embodiment, the liquid crystal layer may employ a vertical alignment (VA) mode, a patterned vertical alignment (PVA) mode, or a super-patterned vertical alignment (S-PVA) mode, although the present disclosure is not limited thereto. The liquid crystal layer 130 may optionally further include a sealing layer 131 at both ends thereof to prevent the liquid crystal from flowing out or from being contaminated by external moisture. In addition, the liquid crystal layer may optionally further include a spacer to achieve a space allowing the liquid crystal layer to have a predetermined thickness.

The first substrate 110 may be formed on one surface of the liquid crystal layer 130 to support the liquid crystal layer 130 and the first polarizing plate 140.

In one embodiment, the first substrate 110 may be a TFT substrate. On a lower surface of the first substrate 110, a pixel region 111 having a plurality of TFTs arranged therein and metal interconnection layers 113, 114 connected to the TFTs may be formed. A dummy region 112 is formed between the pixel region 111 and the metal interconnection layer 113. In one embodiment, the dummy region 112 may be formed of resin or may be an empty space.

The first substrate 110 extends beyond the second substrate 120. The first substrate 110 includes a main body 110A and an extended portion 110B directly connected to the main body 110A. The main body 110A may face the second substrate 120 and the extended portion 110B may not face the second substrate 120.

The pixel region 111 formed on the lower surface of the first substrate 110 includes the plurality of TFTs arranged therein and constitutes at least a portion of the display region. The pixel region 111 constitutes the display region S1.

The pixel region 111 may include a plurality of pixels R, G, B, gate lines connected to the plurality of pixels R, G, B, and data lines connected to the plurality of pixels R, G, B. The plurality of pixels R, G, B is located in the display region of the pixel region and may be arranged in a matrix in column and row directions. The plurality of pixels is formed at intersections of the gate lines and the data lines, respectively. Each pixel includes a TFT including a gate, an active layer, a source, and a drain. The gate lines are arranged at regular intervals and each extend in the row direction. The plurality of pixels R, G, B adjacent to one another in the row direction may be connected to the same gate line. The data lines are arranged at regular intervals and each extend in the column direction. The plurality of pixels R, G, B may be connected to the gate lines and the data lines via the TFTs, respectively. When a gate-on voltage is applied to the gate lines, the TFTs are turned on, such that data signals are applied to the pixels through the data lines, respectively.

The dummy region 112, including dummy wires connected between the gate lines and the data lines in the pixel region 111, is formed adjacent to the pixel region 111. The dummy region 112 may optionally constitute a portion of the display region S1 and a portion of the non-display region S2.

The dummy region 112 is formed between the pixel region 111 and the metal interconnection layers 113, 114 and provides a buffer between various metal wires of the gate lines and data lines in the pixel region 111 and the metal interconnection layer 113. The dummy region 112 may have a width P of about 400 μm or less, for example, about 200 μm to about 400 μm. Within this range, the dummy region allows connection between the metal interconnection layer and the pixel region to be well established.

The metal interconnection layers 113, 114 may be formed adjacent to the dummy region 112. The metal interconnection layers 113, 114 include a first metal interconnection layer 113 formed on the main body 110A of the first substrate 110 and a second metal interconnection layer 114 formed on the extended portion 110B of the first substrate 110. The first metal interconnection layer 113 and the second metal interconnection layer 114 are connected to each other and may each constitute the non-display region S2. As will be described below, the first metal interconnection layer 113 and the second metal interconnection layer 114 are hidden by a light shielding layer 150 of the first polarizing plate 140 to be invisible on a screen of the optical display.

The first metal interconnection layer 113 is a layer in which various metal wires extending from the pixel region 111 and the dummy region 112 exist together, and may include a driving integrated circuit (driving IC). The second metal interconnection layer 114 may connect the first metal interconnection layer 113 to a printed circuit board (PCB). Here, connection between the first metal interconnection layer 113 and the PCB may be achieved by a chip-on-film (COF) process, a chip-on-glass (COG) process, a tape carrier package (TCP) process, or the like. The second metal interconnection layer 114 may be connected to the first metal interconnection layer 113 through an anisotropic conductive film (ACF), although the present disclosure is not limited thereto.

Although not shown in FIG. 2, a bonding layer (for example, a sealing layer) may be further formed on the lower surface of the second metal interconnection layer 114 to prevent the second metal interconnection layer 114 from being separated from the first metal interconnection layer 113 and/or the liquid crystal layer 130.

The first substrate 110 may be formed of an insulating material such as glass, polymers, or stainless steel. Glass, polymers, and stainless steel used as a material for the first substrate 110 are well known in the art. The first substrate 110 may be flexible or may not be flexible.

An electrode film for transmitting signals, such as an indium tin oxide (ITO) film, and an alignment film for aligning the liquid crystal in the liquid crystal layer may be optionally further formed on the lower surface of the first substrate 110.

The second substrate 120 may be formed on the other surface (e.g., the lower surface) of the liquid crystal layer 130 to support the liquid crystal layer 130.

In one embodiment, the second substrate 120 is a color filter substrate and may support a color filter layer 121 formed on an upper surface of the second substrate 120. The color filter layer 121 may extract or filter three light components of red (R), green (G), and blue (B) from a plurality of pixels formed in the display region S1 of the second substrate 120, thereby achieving desired colors on the optical display. The color filter layer may employ any suitable configuration known in the art. The color filter layer 121 may be formed in at least a portion of the display region S1 of the optical display to extract or filter light emitted from a light source (not shown in FIG. 2).

Although not shown in FIG. 2, an electrode film for transmitting signals, such as an indium tin oxide (ITO) film, an alignment film for aligning the liquid crystal in the liquid crystal layer, and a black matrix layer may be further formed on the upper surface of the second substrate 120.

The second substrate 120 may be formed of the same material as or a different material from the first substrate 110 as set forth above.

The first polarizing plate 140 may be formed on one surface of the liquid crystal panel, that is, on the upper surface (the light exit surface) of the first substrate 110 to polarize light from the liquid crystal panel and emit the polarized light.

In one embodiment, the first polarizing plate 140 extends beyond the second substrate 120.

In one embodiment, the first polarizing plate 140 may have the same length as the first substrate 110.

The first polarizing plate 140 may include a main body 140A and an extended portion 140B directly connected to the main body 140A. Each of the main body 140A and the extended portion 140B may face the first substrate 110. In addition, the main body 140A may face the second substrate 120, whereas the extended portion 140B may not face the second substrate 120.

The first polarizing plate 140 includes a light shielding layer 150 formed therein, and the light shielding layer 150 may constitute the non-display region S2. The light shielding layer 150 may be formed in the extended portion 140B of the first polarizing plate 140 and a portion of the main body 140A of the first polarizing plate 140. Accordingly, the light shielding layer 150 prevents the metal interconnection layers 113, 114 and at least a portion of the dummy region 112 from being visible.

In one embodiment, the light shielding layer may be formed in the first polarizing plate to face the metal interconnection layers (the first metal interconnection layer 113 and the second metal interconnection layer 114) on the first substrate. Thus, the light shielding layer 150 can prevent the metal interconnection layers 113, 114 on the first substrate 110 from being visible.

In another embodiment, the light shielding layer 150 may be formed in the first polarizing plate 140 to face the metal interconnection layers (the first metal interconnection layer 113 and the second metal interconnection layer 114) and a portion of the dummy region 112 on the first substrate 110, thereby preventing the metal interconnection layers 113, 114 and the portion of the dummy region 112 on the first substrate 110 from being visible.

In a further embodiment, the light shielding layer 150 may be formed in the first polarizing plate 140 to face the metal interconnection layers (the first metal interconnection layer 113 and the second metal interconnection layer 114) and the entire dummy region 112 on the first substrate 110, thereby preventing the metal interconnection layers 113, 114 and the dummy region 112 on the first substrate 110 from being visible.

In this way, the metal interconnection layers 113, 114 are hidden by the light shielding layer 150, such that reflectance of the metal interconnection layers 113, 114 can be reduced, thereby improving visibility of the optical display.

Figure 3:
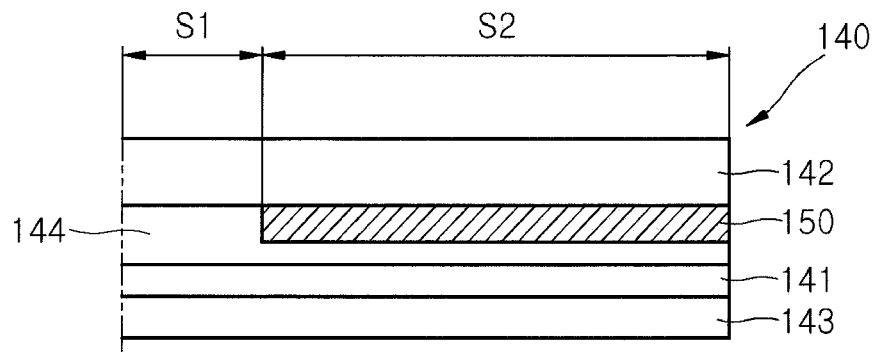
FIG. 3 is a sectional view of a first polarizing plate according to one embodiment of the present invention.

FIG. 3 is a sectional view of a first polarizing plate 140 according to one embodiment of the present invention.

Referring to FIG. 3, the first polarizing plate 140 according to this embodiment may include a polarizer 141; a bonding layer 144 and a first polarizer protective film 142 sequentially stacked on one surface (e.g., the upper surface) of the polarizer 141; and a second polarizer protective film 143 stacked on the other surface (e.g., the lower surface) of the polarizer 141. A light shielding layer 150 may be formed on one surface (e.g., the lower surface) of the first polarizer protective film 142 to be embedded in the bonding layer 144. Since the light shielding layer 150 is embedded in the bonding layer 144, the overall thickness of the optical display can be reduced compared to a polarizing plate in which the lighting shielding layer is not embedded in the bonding layer.

The light shielding layer 150 may be formed at an edge of the bonding layer 144 and surround the bonding layer 144. In one embodiment, the light shielding layer may be formed only at an edge of the bonding layer and have an open rectangular shape.

The thickness of the light shielding layer 150 may be less than or equal to that of the bonding layer 144. In one embodiment, the thickness of the light shielding layer may range from about 50% to about 100% of that of the bonding layer. Within this thickness range, the light shielding layer 150 can be embedded in the bonding layer 144, thereby reducing the overall thickness of the polarizing plate compared to a polarizing plate in which the lighting shielding layer is not embedded in the bonding layer. For example, the light shielding layer may have a thickness of about 4 μm or less, for example, about 0.1 μm to about 4 μm or about 1 μm to about 4 μm.

The light shielding layer 150 serves to block or absorb light and may include a specific design such as a logo of a company or a dot pattern. In other words, the light shielding layer may include a design providing aesthetics to the optical display, thereby satisfying consumer preference.

The light shielding layer 150 may include or may be formed of a composition for light shielding layers described below to have adhesion to the first polarizer protective film 142, thereby allowing the polarizer 141 to be coupled to the first polarizer protective film 142. In this way, the polarizer 141 can be coupled to the first polarizer protective film 142 without a separate bonding layer between the polarizer 141 and the light shielding layer 150 and between the first polarizer protective film 142 and the light shielding layer 150.

The composition for the light shielding layers may include a pigment, a binder resin, and an initiator and may further include at least one of a reactive unsaturated compound, a solvent, and an additive.

The pigment may include carbon black, a mixed pigment of silver-tin alloys, or a combination thereof. Examples of carbon black may include graphitized carbon, furnace black, acetylene black, and Ketjen black, without being limited thereto. The pigment may be used in the form of a pigment dispersion, although the present disclosure is not limited thereto.

The binder resin may include an acrylic resin, a polyimide resin, a polyurethane resin, or a combination thereof. Examples of the acrylic resin may include a methacrylic acid/benzyl methacrylate copolymer, a methacrylic acid/benzyl methacrylate/styrene copolymer, a methacrylic acid/benzyl methacrylate/2-hydroxyethyl methacrylate copolymer, and a methacrylic acid/benzyl methacrylate/styrene/2-hydroxyethyl methacrylate copolymer. The polyurethane resin may be an aliphatic polyurethane resin. The acrylic resin may be an acrylic pressure-sensitive adhesive resin. However, it should be understood that the present invention is not limited thereto.

The reactive unsaturated compound has a lower weight average molecular weight than the binder resin and may include at least one of a photocurable unsaturated compound and a heat-curable unsaturated compound. Examples of the reactive unsaturated compound may include ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol tri(meth)acrylate, pentaerythritol tetra(meth)acrylate, dipentaerythritol penta(meth)acrylate, dipentaerythritol hexa(meth)acrylate, bisphenol A epoxy (meth)acrylate, ethylene glycol monomethyl ether (meth)acrylate, trimethylol propane tri(meth)acrylate, and tris(meth)acryloyloxyethyl phosphate, although the present disclosure is not limited thereto.

The initiator may include at least one of a photopolymerization initiator and a heat-curing initiator. Examples of the photopolymerization initiator may include acetophenone compounds, benzophenone compounds, thioxanthone compounds, benzoin compounds, triazine compounds, and morpholine compounds, without being limited thereto. The heat-curing initiator may include at least one selected from the group consisting of: hydrazide compounds such as 1,3-bis(hydrazinocarbonoethyl-5-isopropylhydantoin); imidazole compounds such as 1-cyanoethyl-2-phenylimidazole, N-[2-(2-methyl-1-imidazolyl)ethyl]urea, 2,4-diamino-6-[2'-methylimidazolyl-(1')]-ethyl-s-triazine, N,N'-bis(2-methyl-1-imidazolylethyl)urea, N,N'-(2-methyl-1-imidazolylethyl)-adipamide, 2-phenyl-4-methyl-5-hydroxymethylimidazole, and 2-phenyl-4,5-dihydroxymethylimidazole; acid anhydride compounds such as tetrahydrophthalic anhydride, ethylene glycol-bis(anhydrotrimellitate); melamine compounds; guanidine compounds; dicyandiamide compounds; and modified aliphatic polyamine compounds.

Examples of the solvent may include: glycol ethers such as ethylene glycol methyl ether, ethylene glycol ethyl ether, and propylene glycol methyl ether; cellosolve acetates such as methyl cellosolve acetate, ethyl cellosolve acetate, and diethyl cellosolve acetate; carbitols such as methylethyl carbitol, diethyl carbitol, diethylene glycol monomethyl ether, diethylene glycol monoethyl ether, diethylene glycol dimethyl ether, diethylene glycol methylethyl ether, and diethylene glycol diethyl ether; and propylene glycol alkyl ether acetates such as propylene glycol methyl ether acetate and propylene glycol propyl ether acetate, although the present disclosure is not limited thereto.

In one embodiment, the composition for the light shielding layers may include about 1 wt % to about 50 wt % of the pigment (or the pigment dispersion), about 0.5 wt % to about 20 wt % of the binder resin, about 0.1 wt % to about 10 wt % of the initiator, and the balance of the solvent. Within these ranges, the light shielding layer 150 can be formed in a slim structure while achieving a good light shielding effect. In another embodiment, the composition for the light shielding layers may include about 1 wt % to about 50 wt % of the pigment (or the pigment dispersion), about 0.5 wt % to about 20 wt % of the binder resin, about 0.1 wt % to about 20 wt % of the reactive unsaturated compound, about 0.1 wt % to about 10 wt % of the initiator, and the balance of the solvent. Within these ranges, the light shielding layer 150 can be formed in a slim structure while achieving a good light shielding effect.

The composition for the light shielding layers may further include about 0.1 wt % to about 1 wt % of other additives. For example, the additive may be a silane coupling agent, which serves to promote curing of the light shielding layer through UV irradiation.

Although the light shielding layer 150 is interposed between the first polarizer protective film 142 and the polarizer 141 in FIG. 3, it should be understood that the present invention is not limited thereto and the light shielding layer 150 may be interposed between the second polarizer protective film 143 and the polarizer 141.

The polarizer 141, the first polarizer protective film 142, the second polarizer protective film 143, and the bonding layer 144 may include any suitable structures and compositions known in the art.

The light shielding layer 150 constitutes the non-display region S2 and may include a plurality of printed patterns. The light shielding layer 150 includes the printed patterns in the non-display region S2 to provide the light shielding effect and includes the printed patterns at the interface between the display region S1 and the non-display region S2 to increase uniformity between the display region S1 and the non-display region S2, thereby minimizing a visibility difference therebetween.

Figure 4:
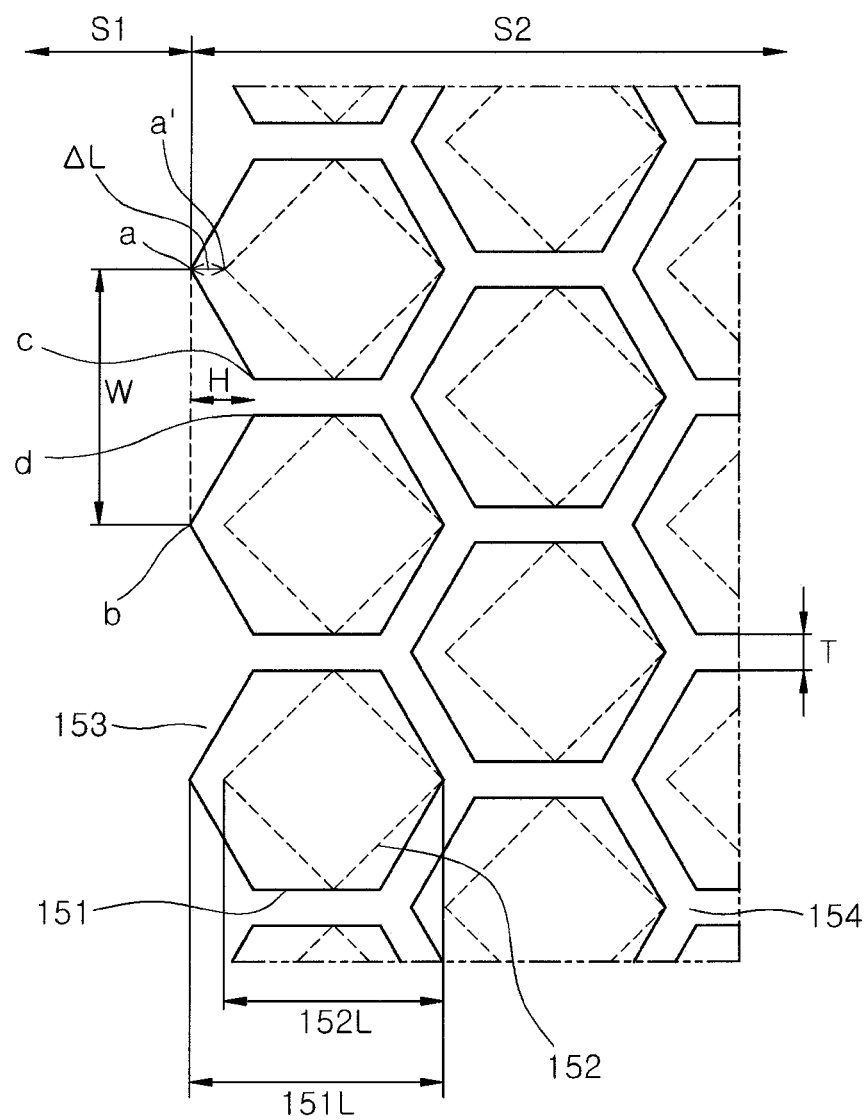
FIG. 4 is an enlarged sectional view of a printed pattern formed at the interface between a display region and a non-display region of a light shielding layer in the first polarizing plate of FIG. 3.

FIG. 4 is an enlarged view of printed patterns formed at the interface between the display region S1 and the non-display region S2 of the first polarizing plate 140 of FIG. 3. However, it should be understood that the printed patterns may be formed over the entire light shielding layer 150, including the interface between the display region S1 and the non-display region S2 of the light shielding layer 150.

Referring to FIG. 4, the light shielding layer 150 may include a printed region composed of the plurality of printed patterns 153. The rest or remainder of the light shielding layer corresponds to a non-printed region 154. The printed patterns 153 are separated from each other.

Each of the printed patterns 153 includes a first printed layer 151 and a second printed layer 152 formed (e.g., directly formed) on the first printed layer 151. The second printed layer 152 may have a different shape than the first printed layer 151 to provide the light shielding effect even when the light shielding layer is formed in a slim structure. However, it should be understood that the present invention is not limited thereto and the second printed layer 152 may have the same shape as the first printed layer 151.

In one embodiment, the second printed layers 152 may have a smaller unit area than the first printed layers 151.

In one embodiment, the number of the second printed layers 152 per unit area of the non-display region may be greater than that of the first printed layers 151.

A point at which one first printed layer 151 adjoins the interface between the display region S1 and the non-display region S2 is indicated by Point a, and a point at which another first printed layer 151 adjacent to the one first printed layer 151 adjoins the interface between the display region S1 and the non-display region S2 is indicated by Point b. The closest vertex of the one first printed layer 151 to Point a is indicated by Point c, and the closest vertex of the other first printed layer 151 to Point b is indicated by Point d. A minimum value among the distance from the interface between the display region S1 and the non-display region S2 to Point c and the distance from the interface between the display region S1 and the non-display region S2 to Point d is indicated by H. In one embodiment, H may be about 200 µm or less, for example, about 0.1 µm to about 200 µm or about 5 µm to about 200 µm. Within this range of H, the light shielding layer 150 can achieve the light shielding effect and uniformity between the display region S1 and the non-display region S2 can be improved to reduce a visibility difference therebetween while preventing R, G, B in a pixel from being visible.

In FIG. 3 and FIG. 4, the first printed layer 151 is shown as a lowermost printed layer of the printed pattern, which directly contacts the first polarizer protective film 142. However, it should be understood that the present invention is not limited thereto and the first printed layer 151 may be formed between other printed layers without contacting the first polarizer protective film 142.

In the present invention, H and the width P of the dummy region 112 may satisfy Equation 1:

$$H \leq P/2 \qquad \text{Equation 1}$$

When Equation 1 is satisfied, the light shielding layer 150 can sufficiently conceal the metal interconnection layers 113, 114 even when the polarizing plate 140 shrinks or expands under high temperature and/or high temperature and high humidity conditions. As described above, the light shielding layer 150 is formed inside the polarizing plate 140. Accordingly, when the optical display 10 is left under high temperature and/or high temperature and high humidity conditions, the light shielding layer 150 can fail to conceal the metal interconnection layers 113, 114 due to shrinkage or expansion of the polarizing plate 140. According to the present invention, H and P are adjusted to satisfy Equation 1, thereby allowing the light shielding layer 150 to function as a non-display region capable of sufficiently concealing the metal interconnection layers 113, 114 even when the polarizer shrinks or expands under high temperature and/or high temperature and high humidity conditions. In Equation 1, "P/2" means P÷2.

As used herein, the term "interface between the display region and the non-display region" refers to an (imaginary) line connecting points of the first printed layers 151 formed in the non-display region S2, which are closest to the display region S1.

The point at which the first printed layer 151 adjoins the interface between the display region S1 and the non-display region S2 is indicated by Point a and the closest point of the corresponding second printed layer 152 (e.g., the second printed layer 152 on the first printed layer 151) to the interface between the display region S1 and the non-display region S2 is indicated by Point a'. The shortest distance ΔL between Point a and Point a' may be about 200 μm or less, for example, about 0.1 μm to about 200 μm or about 10 μm to about 200 μm. Within this range of ΔL, the light shielding layer 150 can achieve the light shielding effect and uniformity between the display region S1 and the non-display region S2 can be improved to reduce a visibility difference therebetween.

A difference in length between a maximum major axis 151L of the first printed layer 151 and a maximum major axis 152L of the corresponding second printed layer 152 (e.g., the second printed layer 152 on the first printed layer 151) may be about 200 μm or less, for example, about 0.1 μm to about 200 μm or about 10 μm to about 200 μm. Within this range, the light shielding layer 150 can achieve the light shielding effect and uniformity between the display region S1 and the non-display region S2 can be improved to reduce a visibility difference therebetween while preventing RGB in a pixel from being visible upon operation of an optical display. The maximum major axis 151L of the first printed layer 151 may have a length of about 50 μm to about 600 μm, for example, about 100 μm to about 500 μm and the maximum major axis 152L of the second printed layer 152 may have a length of about 50 μm to about 500 μm, for example, about 50 μm to about 350 μm.

A point at which one first printed layer 151 adjoins the interface between the display region S1 and the non-display region S2 is indicated by Point a, and a point at which another first printed layer 151 adjacent to the one first printed layer 151 adjoins the interface between the display region S1 and the non-display region S2 is indicated by Point b. A distance from a to b is indicated by W. In one embodiment, W may range from about 10 μm to about 500 μm, for example, about 10 μm to about 490 μm or about 10 μm to about 480 μm. For example, W may be greater than H (W>H).

In one embodiment, the printed patterns may satisfy Equation 2:

$$0.1 \times W \leq H \leq 0.5 \times W \qquad \text{Equation 2}$$

Equation 2 is set to achieve uniformity at the interface between the display region and the non-display region in order to achieve uniformity of the first printed layer 151 directly adjoining the interface between the display region S1 and the non-display region S2.

Referring to FIG. 4, the first printed layer 151 may have a regular hexagonal shape and the second printed layer 152 may have a rhombic shape. However, it should be understood that the present invention is not limited thereto. For example, the first printed layer 151 may have an n-gonal shape (n being an integer of 3 to 10) such as a hexagonal shape (n=6), a circular shape, an elliptical shape, or an amorphous shape, and the second printed layer 152 may have an n-gonal shape (n being an integer of 3 to 10) such as a hexagonal shape (n=6), a circular shape, an elliptical shape, or an amorphous shape.

Sides constituting the first printed layer 151 may have the same or different lengths. For example, each of the sides constituting the first printed layer 151 may have a length of about 10 μm to about 400 μm, for example, about 50 μm to about 300 μm. Sides constituting the second printed layer 152 may have the same or different lengths. For example, each of the sides constituting the second printed layer 152 may have a length of about 10 μm to about 400 μm, for example, about 50 μm to about 300 μm.

In one embodiment, the length of one side of the first printed layer 151 may be the same as or different from the length of one side of the second printed layer 152. For example, the length of one side of the first printed layer 151 may be the same as the length of one side of the second printed layer 152.

In one embodiment, the first printed layer 151 may have a regular hexagonal shape and may be arranged in a honeycomb shape, and the second printed layer 152 may have a rhombic, square, or amorphous shape.

The second printed layer 152 may have a smaller area than the first printed layer 151. With this structure, the second printed layer 152 can be formed on the first printed layer 151. In one embodiment, the number of intersection points between the first printed layer 151 and the second printed layer 152 may be at least two, for example, three or more. Within this range, the light shielding layer 150 can achieve high uniformity between the display region S1 and the non-display region S2, thereby reducing a visibility difference therebetween while preventing R, G, B in the pixel from being visible.

A separation distance T between a pair of adjacent printed patterns 151 may range from about 1 μm to about 50 μm, for example, about 5 μm to about 30 μm. Within this range, the light shielding layer 150 can achieve the light shielding effect without adversely affecting uniformity between the display region S1 and the non-display region S2.

The first printed layer 151 may have the same thickness as or a different from that of the second printed layer 152. Each of the first printed layer 151 and the second printed layer 152 may have a thickness of less than about 4 μm, for example, about 0.1 μm to less than about 4 μm. Within this thickness range, the light shielding layer 150 can be formed inside the bonding layer 144, thereby allowing reduction in thickness of the polarizing plate 140, compared to a polarizing plate in which the light shielding layer 150 is not formed inside the bonding layer 144, while achieving the light shielding effect.

In FIG. 4, the printed pattern is shown as having a bilayer structure of the first printed layer 151 and the second printed layer 152. However, it should be understood that the present invention is not limited thereto and the printed pattern may have a monolayer structure or a multilayer structure of three or more layers.

Referring to FIG. 2 again, the second polarizing plate 160 may be formed on the other surface of the liquid crystal panel, that is, on the lower surface of the second substrate 120, to polarize light from a light source and emit the polarized light to the liquid crystal panel. The second polarizing plate 160 may include a polarizer and a protective film formed on at least one surface of the polarizer. Here, the polarizer and the protective film may include any suitable structures and compositions known in the art.

Although not shown in FIG. 2, the first polarizing plate 140 and the second polarizing plate 160 may be secured to the first substrate 110 and the second substrate 120, respectively, using a typical adhesive or bonding agent.

The securing member 170 serves to secure the first substrate 110, the liquid crystal layer 130, the second substrate 120, and the second polarizing plate 160 to one another. Accordingly, it is possible to stably support the first polarizing plate 140 and the first substrate 110, which extend beyond the second substrate 120.

The securing member 170 may contact the first substrate 110, the liquid crystal layer 130, the second substrate 120, and the second polarizing plate 160. In one embodiment, the securing member 170 may contact the extended portion 110B of the first substrate 110 and the liquid crystal layer 130. In one embodiment, the securing member 170 may completely fill a region surrounding the first substrate 110, the liquid crystal layer 130, the second substrate 120, and the second polarizing plate 160.

The securing member 170 may be formed by applying an adhesive film, such as an optically clear adhesive (OCA) or a pressure sensitive adhesive (PSA), to a predetermined thickness, or by injecting a sealing agent into the region.

In FIG. 2, the securing member 170 is shown as contacting the first substrate 110, the liquid crystal layer 130, the second substrate 120, and the second polarizing plate 160. However, it should be understood that the present invention is not limited thereto and the securing member may contact the first substrate 110 and at least a portion of the liquid crystal layer 130 or may contact the first substrate 110, the liquid crystal layer 130, the second substrate 120, and a portion of the second polarizing plate 160. In one embodiment, the securing member 170 may be omitted.

Next, the present invention will be described in more detail with reference to some examples.

Preparative Example 1 and Preparative Example 2

As a pigment dispersion (A) (pigment content: 30 wt %), a mixture of a pigment dispersion (A-1) containing a silver-tin alloy (TMP-DC-1, Sumitomo Osaka Cement Co., Ltd., pigment solid content: 30%, weight ratio of silver to tin: 7:3) and a pigment dispersion (A-2) containing carbon black (CI-M-050, Sakata Inx Corp.) mixed as listed in Table 1 was used. As binder resins (B), an aliphatic polyurethane binder resin (B-1) (SUO-1000, SHINA T&C Co., Ltd.) and an acrylic pressure-sensitive adhesive resin (B-2) (WA-9263, WOOIN CHEMTECH) were used. Dipentaerythritol hexaacrylate (HanNong Chemicals Inc.) was used as a reactive unsaturated compound (C); IGR 369 was used as a photopolymerization initiator (D-1); a melamine curing agent (M60, WOOIN CHEMTECH) was used as a heat-curing initiator (D-2); propylene glycol methyl ether acetate was used as a solvent (E); and 765 W (Tego Co., Ltd.) was used as (F) a silane coupling agent.

Composition for the light shielding layers were prepared by mixing the pigment dispersion, the binder resin, the reactive unsaturated compound, the initiator, the solvent, and the silane coupling agent described above in a mixing ratio shown in Table 1.

TABLE 1

| | A (wt %) | | B-1 (wt %) | B-2 (wt %) | C (wt %) | D-1 (wt %) | D-2 (wt %) | E (wt %) | F (wt %) |
| --- | --- | --- | --- | --- | --- | --- | --- | --- | --- |
| | A-1 | A-2 | | | | | | | |
| Preparative Example 1 | 25 | 20 | 8 | — | 3 | 3 | — | 40 | 1 |
| Preparative Example 2 | 25 | 20 | 8 | 3 | — | — | 3 | 40 | 1 |

Example 1

A first printed layer was formed along the periphery of one surface of a polyethylene terephthalate (PET) film through gravure coating of the composition for light shielding layers prepared in Preparative Example 1. In one embodiment, a print roll the first printed layer was formed thereon with patterns corresponding to the first printed layer, having a regular hexagonal shape, each side of which had a length of 50 μm, and separated from each other to form a honeycomb structure. After printing the first printed layer, a second printed layer was formed thereon using another printing roll. The second printed layer was also formed of the composition for light shielding layers prepared in Preparative Example 1. In one embodiment, a printing roll for the second printed layers was formed with patterns corresponding to the second printed layer, having a rhombus shape, each side of which had a length of 50 μm, and separated from each other. Pattern printing was performed such that the second printed layer could be formed on the first printed layer and the major axis of the first printed layer was parallel to the major axis of the second printed layer. Finally, a light shielding layer having a structure as shown in FIG. 4 was formed one surface of the PET film. Specifically, the light shielding layer (thickness: 3 μm) was formed by removing the solvent at 85° C. for 1 minute, followed by curing through UV irradiation at a fluence of 650 mJ using a metal halide lamp.

A polyvinyl alcohol film (thickness: 60 μm, polymerization degree: 2,400, saponification degree: 99.0%, VF-PS6000, Kuraray Co., Ltd., Japan) was subjected to swelling in an aqueous solution at 25° C., followed by dyeing and stretching in an iodine ion-containing dyeing bath at 30° C. Then, the dyed polyvinyl alcohol film was further stretched to 6 times an initial length thereof in a boric acid solution at 55° C. The obtained polyvinyl alcohol film was dried in a chamber at 50° C. for 3 minutes, thereby preparing a polarizer (thickness: 12 μm).

A bonding agent was applied to one surface of the PET film on which the light shielding layer was formed, followed by application of the bonding agent to one surface of a cyclo-olefin polymer film (ZB12-052125, Zeon Corporation) as a second polarizer protective film, and then the PET film and the cyclo-olefin polymer film were bonded to opposite surfaces of the polarizer, respectively, followed by curing, thereby preparing a polarizing plate. Then, a bonding layer (OS-207, Soken Chemical) was formed on the other surface of the cyclo-olefin polymer film, thereby obtaining a final first polarizing plate.

Example 2 and Example 3

A first polarizing plate was prepared in the same manner as in Example 1 except that dimensions of the first printed layer and the second printed layer were changed as listed in Table 2.

Example 4

A first polarizing plate was prepared in the same manner as in Example 1 except that, in formation of the first printed layer and the second printed layer, the composition prepared in Preparative Example 2 was used instead of the composition prepared in Preparative Example 1 and curing of the first printed layer and the second printed layer was performed through heat curing at 85° C. for 2 minutes.

Comparative Example 1

A first polarizing plate was prepared in the same manner as in Example 1 except that dimensions of the first printed layer and the second printed layer were changed as listed in Table 2.

An optical display sample was fabricated using the prepared polarizing plate and then evaluated as to properties listed in Table 2. The prepared first polarizing plate was bonded to a light exit surface of a liquid crystal panel. Then, a second polarizing plate (a polarizing plate having a protective film (TAC film) attached to both surfaces of a polarizer) was attached to a light incident surface of the liquid crystal panel, thereby fabricating an optical display sample having a shape as shown in FIG. 2. A dummy region of the liquid crystal panel had a width of 400 μm.

(1) Visibility of metal interconnection layer: After each of the optical display samples obtained in Examples 1 to 4 and Comparative Example 1 was left at 85° C. for 500 hours or at 85° C. and 85% RH for 500 hours, visibility of a metal interconnection layer was determined with the naked eye. When the metal interconnection layer was visible, a corresponding sample was rated as "visible", and, when the metal interconnection layer was not visible, a corresponding sample was rated as "invisible".

(2) Light shielding property: Light shielding properties of the light shielding layer of each of the polarizing plates obtained in Examples 1 to 4 and Comparative Example 1 was measured with a UV filter using an optical densitometer (TD-904, GretagMacbeth Co.) in accordance with JIS K7651:1988. In Table 2, light shielding properties of the light shielding layer were represented by absorbance at a wavelength of 550 nm on a UV-visible spectrophotometer (JASCO-750). When a value of the absorbance was higher than or equal to 2.0, the light shielding layer was rated as "⊚"; when a value of the absorbance was higher than 1.5 and less than 2.0, the light shielding layer was rated as "○"; when a value of the absorbance was higher than 1.0 and less than or equal to 1.5, the light shielding layer was rated as "Δ"; and, when a value of the absorbance was less than or equal to 1.0, the light shielding layer was rated as "X". A higher absorbance value indicates better light shielding properties.

(3) Visibility of RGB in pixel: Each of the optical display samples obtained in Examples 1 to 4 and Comparative Example 1 were driven to determine visibility of RGB with the naked eye. When RGB was invisible and difference in visibility between the display region and the non-display region was not recognized, a corresponding sample was rated as "good", whereas, when RGB was visible and difference in visibility between the display region and the non-display region was recognized, a corresponding sample was rated as "bad".

TABLE 2

|  |  | Example | | | | Comp. Example |
|---|---|---|---|---|---|---|
|  |  | 1 | 2 | 3 | 4 | 1 |
| First printed layer | Shape | Regular hexagon | Regular hexagon | Regular hexagon | Regular hexagon | Regular hexagon |
|  | Length of side (μm) | 50 | 170 | 230 | 50 | 240 |
|  | Length of major axis (μm) | 100 | 340 | 460 | 100 | 480 |
| Second printed layer | Shape | Rhombus | Rhombus | Rhombus | Rhombus | Rhombus |
|  | Length of side (μm) | 50 | 170 | 230 | 50 | 240 |
|  | Length of major axis (μm) | 71 | 240 | 325 | 71 | 339 |
| Composition of light shielding layer | | Preparative Example 1 | Preparative Example 1 | Preparative Example 1 | Preparative Example 2 | Preparative Example 1 |
| H (μm) | | 43 | 147 | 199 | 43 | 208 |
| Width of dummy region (μm) | | 400 | 400 | 400 | 400 | 400 |
| Visibility of metal interconnection layer @85° C., 500 hours | | Invisible | Invisible | Invisible | Invisible | Visible |
| Visibility of metal interconnection layer @85° C., 85% RH, 500 hours | | Invisible | Invisible | Invisible | Invisible | Visible |
| Light shielding property | | ⊚ | ○ | Δ | ⊚ | Δ |
| Visibility of RGB in pixel | | Good | Good | Good | Good | Bad |

As shown in Table 2, it can be seen that the optical display according to the present invention could prevent the metal interconnection layer from being visible even when the polarizing plate shrank or expanded under high temperature and/or high temperature and high humidity conditions. In addition, the optical display according to the present invention could minimize difference in visibility between the display region and the non-display region, thereby preventing RGB in the pixel from being visible.

Conversely, in the optical display obtained in Comparative Example 1 not satisfying Equation 1, the metal interconnection layer was visible when the polarizing plate shrank or expanded under high temperature and/or high temperature and high humidity conditions.

It should be understood that various modifications, changes, alterations, and equivalent embodiments can be made by those skilled in the art without departing from the spirit and scope of the invention.

What is claimed is:

1. An optical display having a display region and a non-display region, the optical display comprising:
   an optical display element comprising a second substrate, a first substrate facing the second substrate, a dummy region on the first substrate, and a metal interconnection layer on the first substrate; and
   a first polarizing plate on an upper surface of the optical display element, the first polarizing plate having a light shielding layer therein to conceal at least a portion of the metal interconnection layer and at least a portion of the dummy region,
   wherein:
   the light shielding layer comprises a plurality of printed patterns separated from each other and each printed pattern of the plurality of printed patterns comprises a first printed layer,
   the first printed layer of a first printed pattern of the plurality of printed patterns comprises a first point at an interface between the display region and the non-display region,
   the first printed layer of the first printed pattern comprises a second point at a vertex of the first printed layer that is closest to the first point,
   the first printed layer of a second printed pattern of the plurality of printed patterns adjacent to the first printed layer of the first printed pattern comprises a third point at the interface,
   the first printed layer of the second printed pattern comprises a fourth point at a vertex of the first printed layer of the second printed pattern that is closest to the third point, and
   the first printed layer of the first printed pattern and the first printed pattern of the second printed pattern satisfy Equation 1:

$$H \leq P/2, \qquad \text{Equation 1}$$

wherein H is a non-zero minimum value among a distance from the interface between the display region and the non-display region to the second point and a distance from the interface between the display region and the non-display region to the fourth point, and P is a width of the dummy region,
   wherein, in a plan view of the optical display, the first printed layer of the first printed pattern in the non-display region is spaced apart from the first printed layer of the second printed pattern in the non-display region along a direction parallel to the interface between the display region and the non-display region by a gap, the gap extending lengthwise in a direction perpendicular to the interface,
   wherein the first printed layer has a regular hexagonal shape, and
   wherein the first printed layer of the first printed pattern and the first printed layer of the second printed pattern are co-planar.

2. The optical display according to claim 1, wherein H is about 200 µm or less.

3. The optical display according to claim 1, wherein P is about 400 µm or less.

4. The optical display according to claim 1, wherein the plurality of printed patterns satisfies Equation 2: Equation 2 $0.1 \times W$ H $0.5 \times W$, wherein W is a distance from the first point to the third point.

5. The optical display according to claim 1, wherein each of the plurality of printed patterns comprises the first printed layer and a second printed layer directly on the first printed layer,
   wherein the second printed layer of the first printed pattern comprises a fifth point closest to the interface between the display region and the non-display region, and
   wherein a shortest distance between the fifth point and the first point is 200 µm or less.

6. The optical display according to claim 5, wherein the first printed layer has a regular hexagonal shape and the second printed layer has a rhombic, square, or amorphous shape.

7. The optical display according to claim 1, wherein the first polarizing plate comprises a polarizer and a bonding layer and a first polarizer protective film sequentially stacked on one surface of the polarizer, and wherein the light shielding layer is on one surface of the first polarizer protective film and embedded in the bonding layer.

8. The optical display according to claim 1, wherein the light shielding layer has a thickness of about 4 µm or less.

9. The optical display according to claim 1, wherein the light shielding layer comprises at least one of carbon black and a mixed pigment of silver-tin alloys.

10. The optical display according to claim 1, wherein the first polarizing plate is at a side of the first substrate of the optical display element.

11. The optical display according to claim 10, wherein each of the first substrate and the first polarizing plate extends beyond the second substrate.

12. The optical display according to claim 11, wherein the first polarizing plate comprises a main body facing the first substrate and an extended portion directly connected to the main body and not facing the first substrate, and wherein the light shielding layer is in the extended portion and a portion of the main body.

13. The optical display according to claim 11, wherein the first substrate comprises a main body facing the second substrate and an extended portion directly connected to the main body and not facing the second substrate, and wherein the metal interconnection layer comprises a first metal interconnection layer on the main body of the first substrate and a second metal interconnection layer on the extended portion of the first substrate.

14. The optical display according to claim 13, wherein the dummy region is between the first metal interconnection layer and a pixel region constituting the display region of the first substrate.

15. The optical display according to claim 13, wherein the light shielding layer faces the first metal interconnection layer, the second metal interconnection layer, and a portion of the dummy region.

16. The optical display according to claim 13, wherein the light shielding layer faces the first metal interconnection layer, the second metal interconnection layer, and an entirety of the dummy region.

17. The optical display according to claim 1, further comprising a second polarizing plate on a lower surface of the optical display element.

18. The optical display according to claim 1, wherein the optical display element comprises a liquid crystal panel comprising a liquid crystal layer or a light emitting diode substrate comprising a luminous material.

* * * * *